US008605533B2

(12) United States Patent
Seo (10) Patent No.: US 8,605,533 B2
(45) Date of Patent: Dec. 10, 2013

(54) APPARATUS AND METHOD FOR PROTECTING DATA IN FLASH MEMORY

(75) Inventor: Hee-Yun Seo, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 427 days.

(21) Appl. No.: 12/954,717

(22) Filed: Nov. 26, 2010

(65) Prior Publication Data

US 2011/0128785 A1    Jun. 2, 2011

(30) Foreign Application Priority Data

Nov. 27, 2009  (KR) .......................... 10-2009-0116249

(51) Int. Cl.
*G11C 5/14*    (2006.01)

(52) U.S. Cl.
USPC ............................. 365/226; 365/228; 365/229

(58) Field of Classification Search
USPC ............. 365/229, 228, 226, 185.04; 711/103; 714/22
See application file for complete search history.

(56) References Cited

U.S. PATENT DOCUMENTS

| 5,446,904 A * | 8/1995 | Belt et al. ....................... 713/323 |
| 6,145,069 A * | 11/2000 | Dye ............................... 711/170 |
| 6,249,841 B1 * | 6/2001 | Sikes et al. ....................... 711/107 |
| 6,856,556 B1 * | 2/2005 | Hajeck ........................ 365/189.11 |
| 2003/0099134 A1 * | 5/2003 | Lasser et al. ............... 365/185.29 |
| 2004/0103238 A1 * | 5/2004 | Avraham et al. ............... 711/102 |
| 2010/0241806 A1 * | 9/2010 | Kawano et al. ................ 711/118 |

* cited by examiner

*Primary Examiner* — Douglas King
(74) *Attorney, Agent, or Firm* — Jefferson IP Law, LLP (57) ABSTRACT

An apparatus for securely protecting data in a flash memory upon power off is disclosed. In the apparatus, a power detector monitors a voltage output from a power supply unit, and outputs a power fail signal when the voltage drops by a predetermined reference voltage or more. A Programmable Logic Device (PLD) outputs a Write Protect (WP) signal for performing write protection on the flash memory upon receiving the power fail signal from the power detector. A WP controller outputs the WP signal output from the PLD to the flash memory, according to a Ready/Busy (R/B) state of the flash memory.

15 Claims, 6 Drawing Sheets

APPARATUS AND METHOD FOR PROTECTING DATA IN FLASH MEMORY

PRIORITY

This application claims the benefit under 35 U.S.C. §119(a) of a Korean Patent Application filed in the Korean Intellectual Property Office on Nov. 27, 2009, and assigned Serial No. 10-2009-0116249, the entire disclosure of which is hereby incorporated by reference.

BACKGROUND OF THE INVENTION

1. Field of the Invention

The present invention relates to a semiconductor memory device, and more particularly, to a NAND flash memory device.

2. Description of the Related Art

A semiconductor memory device is a memory device which can store data and read it out when necessary. Semiconductor memory devices may be roughly classified into a Random Access Memory (RAM) and a Read Only Memory (ROM). The RAM is a volatile memory device, data stored in which disappears upon power off, whereas the ROM is a nonvolatile memory device, data stored in which does not disappear despite power off.

The RAM includes a Dynamic RAM (DRAM) and a Static RAM (SRAM), while the ROM includes a Programmable ROM (PROM), an Erasable PROM (EPROM), an Electrically EPROM (EEPROM), and a flash memory.

The flash memory, though it is a nonvolatile memory, is capable of programming and erasure in the on-line state. Like the EEPROM, the flash memory uses the electrically erasing technology, and its entire data may be erased in one or several seconds. Data stored in the flash memory chip may be erased at a time or on a block basis, but may not be erased on a byte basis. The flash memory may store modifiable control programs, and may be used as a substitute for a secondary memory.

The flash memory is classified into a Negated 'AND' (NAND) flash memory and a Negated 'OR' (NOR) flash memory. The NOR flash memory may easily constitute a circuit with processors and the like, since it uses the SRAM or ROM-type interface scheme. In contrast, the NAND flash memory is complex in the interface scheme, compared with the NOR flash memory. However, the NAND flash memory is advantageous over the NOR flash memory in terms of integration and price.

Recently, the NAND flash memory has become popularly used as a secondary memory of a system due to its advantage that information stored therein is not erased even in the power-off state. However, sometimes information stored in the NAND flash memory may be damaged by power off of the system or an unscheduled outage.

The damaged information in the NAND flash memory may be correctable by an Error Check Code (ECC). However, if the memory is damaged in bulk in units of pages, the information may not be recovered.

Therefore, a method for protecting data in the NAND flash memory upon power off or an unscheduled outage has long been required.

SUMMARY OF THE INVENTION

An aspect of the present invention is to address at least the above-mentioned problems and/or disadvantages and to provide at least the advantages described below. Accordingly, an aspect of exemplary embodiments of the present invention is to provide an apparatus and method for securely protecting data in a Negated 'AND' (NAND) flash memory upon discontinued power.

In accordance with one aspect of the present invention, an apparatus is provided for protecting data in a flash memory. The apparatus includes a power detector for monitoring a voltage output from a power supply unit, and outputting a power fail signal when the voltage drops below a predetermined reference voltage; a Programmable Logic Device (PLD) for outputting a Write Protect (WP) signal for performing write protection on the flash memory upon receiving the power fail signal from the power detector; and a WP controller for outputting the WP signal output from the PLD to the flash memory according to a Ready/Busy (R/B) state of the flash memory.

In accordance with another aspect of the present invention, a method is provided for protecting data in a flash memory. The method includes monitoring a voltage output from a power supply unit, and detecting a power fail signal if the voltage drops by a predetermined reference voltage or more; upon detecting the power fail signal, generating a Write Protect (WP) signal for performing write protection on the flash memory; and outputting the WP signal to the flash memory according to a Ready/Busy (R/B) state of the flash memory.

BRIEF DESCRIPTION OF THE DRAWINGS

The above and other aspects, features and advantages of certain exemplary embodiments of the present invention will be more apparent from the following description taken in conjunction with the accompanying drawings, in which.

Throughout the drawings, the same drawing reference numerals will be understood to refer to the same elements, features and structures.

DETAILED DESCRIPTION OF EXEMPLARY EMBODIMENTS

Exemplary embodiments of the present invention will now be described in detail with reference to the accompanying drawings. In the following description, specific details such as detailed configuration and components are merely provided to assist the overall understanding of exemplary embodiments of the present invention. Therefore, it should be apparent to those skilled in the art that various changes and modifications of the embodiments described herein can be made without departing from the scope and spirit of the invention. In addition, descriptions of well-known functions and constructions are omitted for clarity and conciseness.

Exemplary embodiments of the present invention provide an apparatus and method for securely protecting data in a flash memory. In an exemplary embodiment of the present invention, a state of power is detected upon power off, and a Write Protect (WP) signal is controlled using a Ready/Busy (R/B) signal of a Negated 'AND' (NAND) flash memory to securely protect data in the NAND flash memory.

An exemplary embodiment of the present invention is described in detail below with reference to the accompanying drawings.

Figure 1:
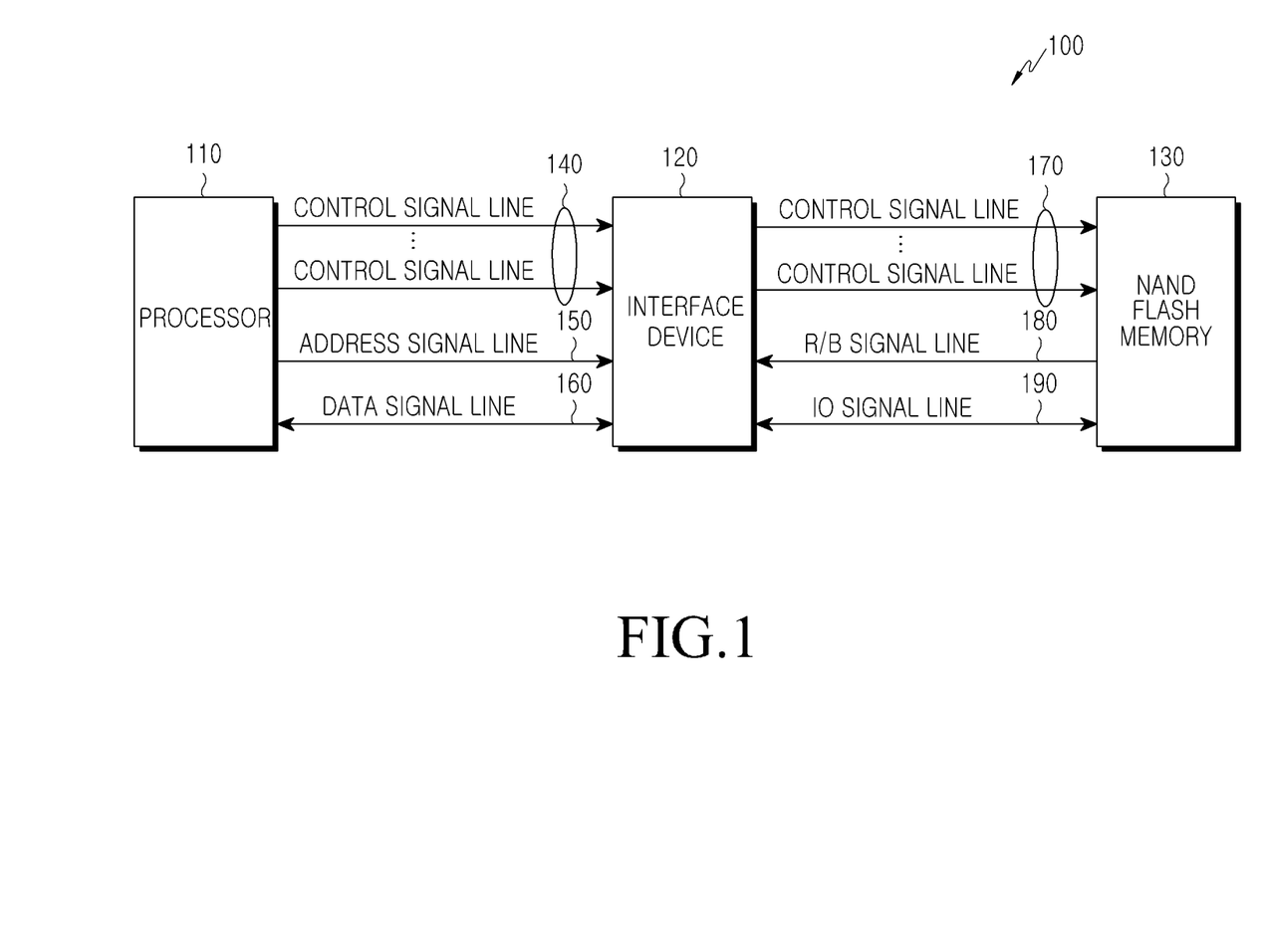
FIG. 1 is a diagram illustrating interfacing in a system with a Negated 'AND' (NAND) flash memory according to an exemplary embodiment of the present invention.

FIG. 1 illustrates interfacing in a system with a NAND flash memory according to an exemplary embodiment of the present invention.

Referring to FIG. 1, a system 100 includes a processor 110, an interface device 120, and a NAND flash memory 130. Descriptions of other components of the system 100, not being novel to the present invention, may be omitted herein for clarity and conciseness.

The processor 110, a common Central Processing Unit (CPU), controls the overall operation of the system, and also controls an operation of the NAND flash memory 130. The processor 110 includes a plurality of control signal lines 140, an address signal line 150, and a data signal line 160 intervening between the processor 110 and the interface device 120. The control signal lines 140 transport Chip Select (CS), Read, and Write commands.

The interface device 120 controls interfacing between the processor 110 and the NAND flash memory 130. To this end, the interface device 120 includes a plurality of control signal lines 170, an R/B signal line 180, and an Input/Output (IO) signal line 190 intervening between the interface device 120 and the NAND flash memory 130 to control an operation of the NAND flash memory 130 upon receiving a control command from the processor 110.

The plurality of control signal lines 170 carry Chip Enable (CE), Address Latch Enable (ALE), Command Latch Enable (CLE), Write Enable (WE), Read Enable (RE), and Write Protect (WP) signals.

The CE signal means a chip select signal, the CLE signal means a command input time, and the ALE signal means an address input time. In addition, the WE and RE signals mean write and read commands, respectively, and the WP signal means a write protect command. In particular, the WP signal forcefully stops an operation of the NAND flash memory 130. When the WP signal is in a Low state, data in the NAND flash memory 130 is preserved in any external conditions.

Various devices may be used as the interface device 120. In an exemplary embodiment of the present invention, a Programmable Logic Device (PLD) may be used as the interface device 120.

The NAND flash memory 130 is divided into blocks, pages and sectors, and data may be read out from and written to the NAND flash memory 130 on a page-by-page basis. The NAND flash memory 130 also includes the plurality of control signal lines 170, the R/B signal line 180, and the IO signal line 190 intervening between the NAND flash memory 130 and the interface device 120.

If a command(s) to be forwarded is received from the processor 110 through the control signal lines 140, data to be written or read is received through the data signal line 160, a memory address where data is to be written or read is received through the address signal line 150, and the interface device 120 outputs a control command corresponding to any one of CE, ALE, CLE, WE, RE, and WP to the NAND flash memory 130 through the control signal lines 170 and writes or reads an address and data to or from the NAND flash memory 130 through the IO signal line 190.

For example, among control signals on the control signal lines 170 from the interface device 120 to the NAND flash memory 130, if the ALE signal is a Low state, an address signal is transferred through the IO signal line 190, and if the CLE signal is in a Low state, data is transferred through the IO line 190.

In this connected state, the processor 110 delivers a command for controlling an operation of the NAND flash memory 130 and operation information required for execution of the command, to the interface device 120. The operation information required for execution of a command includes an address of an area where data is to be read from the NAND flash memory 130 in a Read operation, and includes an address of an area where data is to be stored in the NAND flash memory 130, and the data to be stored, in a Write operation. Upon receiving a command from the processor 110, the interface device 120 controls the NAND flash memory 130 to execute an operation corresponding to the command.

For example, upon receiving a Read command from the processor 110, the interface device 120 makes the CE and CLE control signals on the control signal lines 170 transition to a Low state, and forwards the Read command to the NAND flash memory 130 through the IO signal line 190. After forwarding the command, the interface device 120 makes the ALE control signal on the control signal lines 170 transition to a Low state, and transfers an address to the NAND flash memory 130 through the IO signal line 190. Upon receiving the command and the address, the NAND flash memory 130 shifts data from an internal memory cell array to an internal memory buffer. At this point, the R/B signal transitions to a Low state, indicating that the NAND flash memory 130 is in a Busy state. In the NAND flash memory 130, if it is determined that the operation is completed, the R/B signal transitions to a High state, indicating that the NAND flash memory 130 is in a Read state, and the data stored in the internal memory buffer is transferred from the NAND flash memory 130 to the interface device 120 through the IO signal line 190. The interface device 120 forwards the received data to the processor 110 through the data signal line 160.

Upon receiving a Write command from the processor 110, the interface device 120 forwards the command and its associated address in the same way as when receiving a Read command. That is, the interface device 120 forces the CE and CLE control signals on the control signal lines 170 to transition to a Low state and outputs the Write command to the NAND flash memory 130 through the IO signal line 190, and the interface device 120 forces the CE and ALE control signals to transition to a Low state and outputs an address to the NAND flash memory 130 through the IO signal line 190. After outputting the address to the interface device 120, the processor 110 sequentially receives related data through the interface device 120. After inputting the data to the interface device 120, the processor 110 re-sends the command.

A Write command is input twice: a first command is a command to input data to a memory buffer in the NAND flash memory 130, and a second command is a command to transfer data from the memory buffer to a memory cell array. As in the case of the Read command, if it is determined that the operation is completed, the R/B signal line 180 transitions to a High state. By monitoring the IO signal line 190, the interface device 120 checks whether the operation has been normally performed. The check information is stored in the interface device 120, and the processor 110 may determine the operation results referring to the check information.

In the NAND flash memory 130, if it is determined that the operation is completed, the R/B signal line 180 transitions to a High state, and the data stored in the internal memory buffer is transferred to the processor 110 through the IO signal line 190 and the interface device 120. Among the control signals on the control signal lines 170, CE, RE and WE are the same as those used in the common Static Random Access Memory (SRAM) in terms of the interface scheme.

Figure 2:
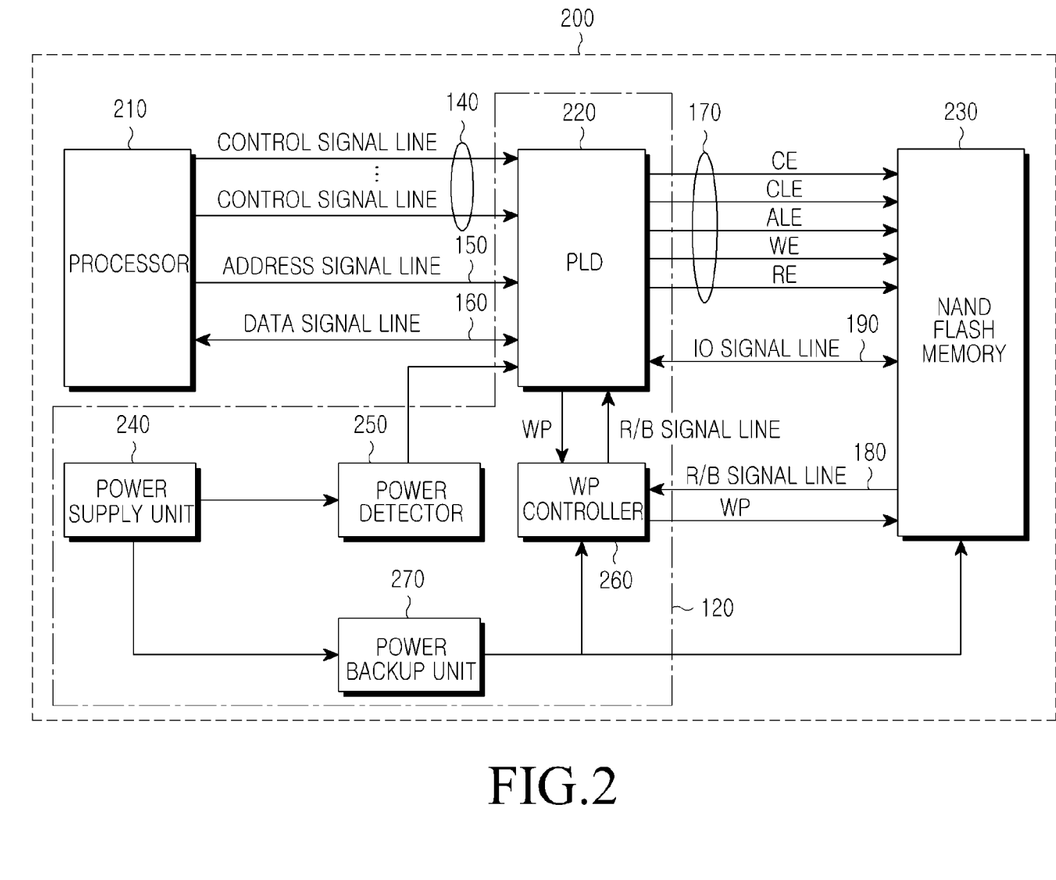
FIG. 2 is a diagram illustrating architecture of a system for protecting data in a NAND flash memory according to an exemplary embodiment of the present invention.

FIG. 2 illustrates a system for protecting data in a NAND flash memory according to an exemplary embodiment of the present invention.

Referring to FIG. 2, a system 200 includes a processor 210, a Programmable Logic Device (PLD) 220, a NAND flash memory 230, a power supply unit 240, a power detector 250, a WP controller 260, and a power backup unit 270. Descriptions of other components of the system 200, not being novel to the present invention, may be omitted herein for clarity and conciseness.

In FIG. 2, the PLD 220, the power supply unit 240, the power detector 250, the WP controller 260, and the power backup unit 270 are components included in the interface device 120 of FIG. 1. The processor 210 controls the overall operation of the system and an operation of the NAND flash memory 230.

Though performing various functions according to the types of products, the PLD 220 serves as an interface device in an exemplary embodiment of the present invention. That is, the PLD 220 generates various signals for controlling the NAND flash memory 230.

Upon receiving a power fail signal from the power detector 250, the PLD 220 outputs a WP signal to the WP controller 260. That is, upon power off, the PLD 220 outputs the WP signal in a Low state to the WP controller 260 to stop an operation of the NAND flash memory 230. In other words, upon receiving a power fail signal from the power detector 250, the PLD 220 outputs a Low-state WP signal for the NAND flash memory 230 to the WP controller 260.

The NAND flash memory 230 receives specific control signals from the PLD 220, and performs Read, Write, and Erase operations corresponding thereto. When performing the Read, Write, and Erase operations, the NAND flash memory 230 transitions to a Busy state. To this end, the NAND flash memory 230 receives commands and address information from the PLD 220 through the CLE and ALE signals. Thereafter, the NAND flash memory 230 executes Read, Write, and Erase operations using the commands and address information, and outputs a Busy signal indicating the ongoing execution of the operations to the PLD 220 and the WP controller 260 on the R/B signal line 180.

The power supply unit 240 converts external input Alternating Current (AC) power into Direct Current (DC) power of a predetermined voltage, for example, 3.3 volts (V). The output DC power is supplied to components of the system 200, for the overall operation of the system.

The power detector 250 outputs a power fail signal to the PLD 220 upon detecting a drop of the voltage below a predetermined level, for example, upon power off of the system. Generally, a trip point for power detection is set as a point where 10% of the full voltage drops. For example, for the exemplary full voltage of 3.3V, a power fail signal transitions to a Low state at a trip point of 3V where a voltage drop of 10% occurs.

That is, the power detector 250 monitors the voltage output from the power supply unit 240, and outputs a power fail signal if it is determined that the voltage drops by a predetermined reference voltage (in this example, 10% of the full voltage).

Meanwhile, since the processor 210 may normally operate even at a lower voltage level, for example, 2V, it can access the NAND flash memory 230 until the voltage reaches the lower voltage level during power off.

Using the WP signal received from the PLD 220 and the R/B signal output from the NAND flash memory 230, the WP controller 260 controls the WP signal. That is, even though the WP signal is received from the PLD 220, the WP controller 260 outputs the WP signal only when a Busy signal is output from the NAND flash memory 230. In other words, in accordance with an exemplary embodiment of the present invention, the WP controller 260 outputs the WP signal received from the PLD 220 to the NAND flash memory 230, according to the R/B state of the NAND flash memory 230. In other words, if it is determined that the WP signal is received from the PLD 220 while the NAND flash memory 230 is in a Busy state, the WP controller 260 delays the WP signal until the NAND flash memory 230 transitions to a Ready state.

To be specific, if it is determined that a state signal output from the NAND flash memory 230 is a Busy signal indicating an ongoing access to memory cells in the NAND flash memory 230, then the WP controller 260 outputs the WP signal in a High state to disable the write protection. In other words, upon receiving the Busy signal, the WP controller 260 outputs a High-state WP signal, avoiding stopping an operation of the NAND flash memory 230 by force. The reason is that memory cells may be damaged if the write protection is performed during an access to the memory cells in the NAND flash memory 230.

Thereafter, if a High-state Ready signal is received as the operation of the NAND flash memory 230 is completed, the WP controller 260 outputs a Low-state WP signal to the NAND flash memory 230. When the WP signal is transitioned to a Low state, the NAND flash memory 230 does not operate in reply to any control, securely protecting data stored therein.

The power backup unit 270 supplies backup power to the NAND flash memory 230 and to the WP controller 260 from a detection of the power fail signal till termination of the operation of NAND flash memory 230.

For example, if the write protection is performed during an access to memory cells in the NAND flash memory 230 after the power fail signal is detected, the memory cells may be damaged, so there is a need for a time period in which the access to the memory cells can be normally completed. Examples of the required times are as shown in Table 1 below.

TABLE 1

|  |  | SLC | | MLC | |
| --- | --- | --- | --- | --- | --- |
| Time | | Nor. | Max. | Nor. | Max. |
| Page Writing | (tPROG) | 0.2 ms | 0.7 ms | 0.8 ms | 3 ms |
| Dummy Busy time for multi-plane program (Writing) | (tDBSY) | 0.5 μs | 1 μs | 0.5 μs | 1 μs |
| Block Erase time | (tBERS) | 1.5 ms | 2 ms | 1.5 ms | 10 ms |

Referring to Table 1, it can be understood that generally, a block erasure operation of the NAND flash memory requires the longest time. Therefore, the power backup unit 270 is required to set its power backup time to be longer than the maximum required time, for example, the block erase time of 10 ms.

Structures and operations of the power backup unit 270 and the WP controller 260 according to an exemplary embodiment of the present invention will now be described in detail.

Figure 3:
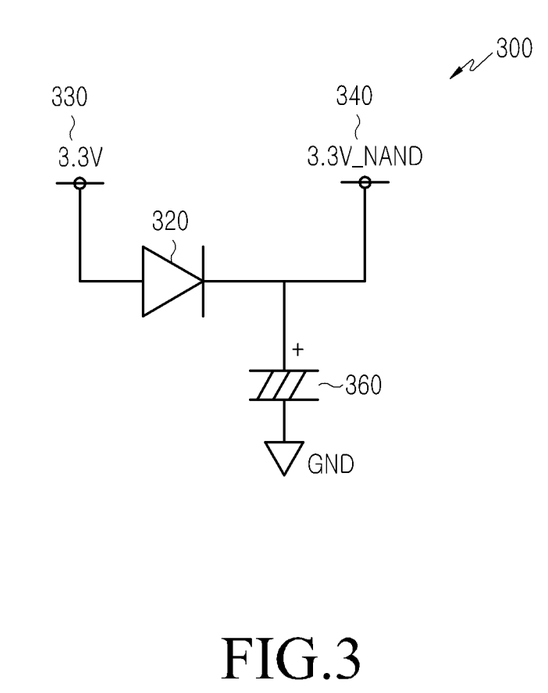
FIG. 3 is a circuit diagram of a power backup unit according to an exemplary embodiment of the present invention.

FIG. 3 illustrates a circuit diagram of a power backup unit according to an exemplary embodiment of the present invention.

Referring to FIG. 3, a power backup unit 300 includes a capacitor 360, a diode 320, a first power terminal 330, and a second power terminal 340. Upon power off, the capacitor 360 supplies power for continuing operations of the NAND flash memory 230 and the WP controller 260 while the operation of the NAND flash memory 230 is completed. The diode 320 prevents the current charged in the capacitor 360 from flowing toward the first power terminal 330. The first power terminal 330 is connected to the power supply unit 240, and the second power terminal is connected to the NAND flash memory 230 and the WP controller 260.

Figure 4:
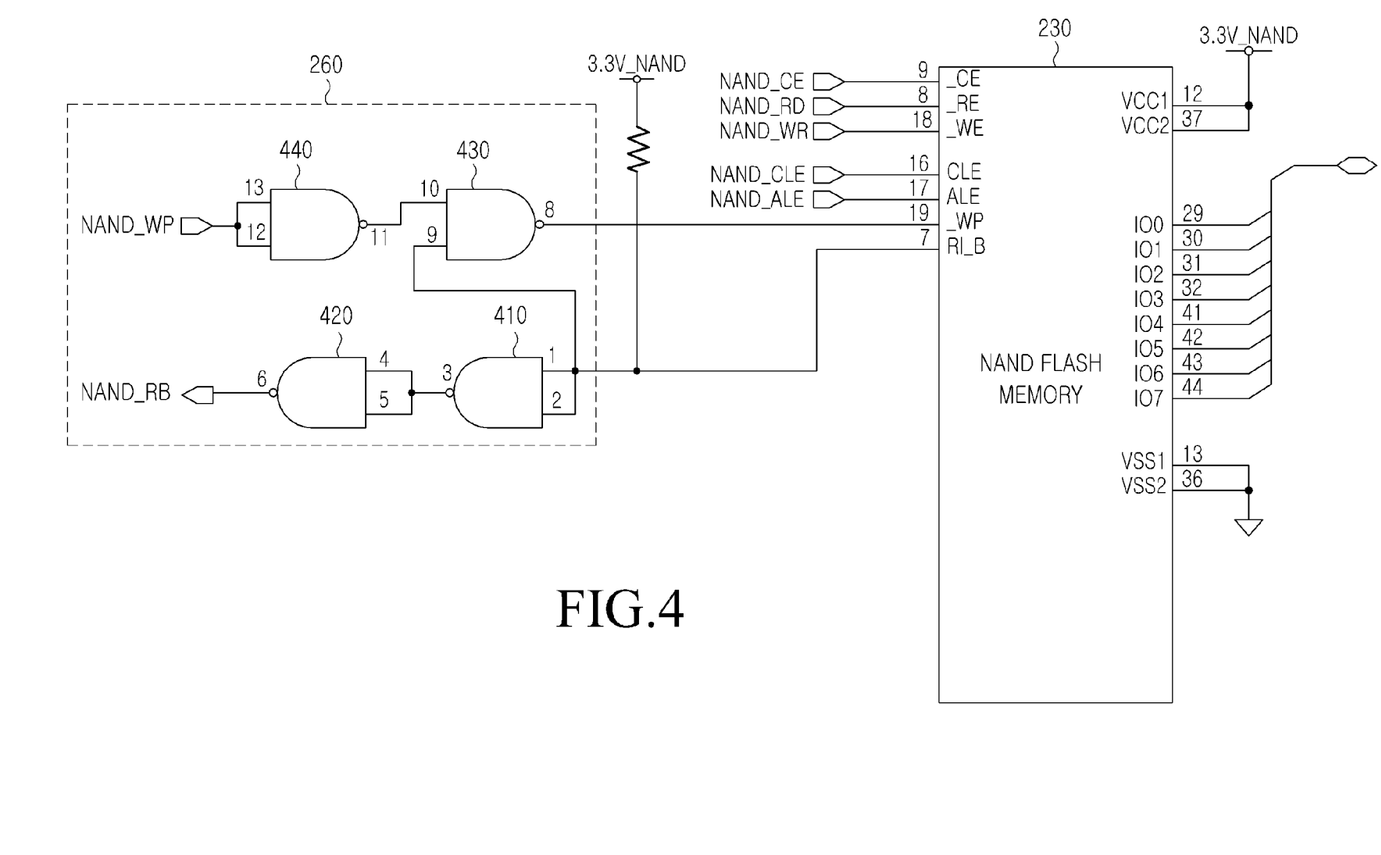
FIG. 4 is a circuit diagram of a Write Protect (WP) controller according to an exemplary embodiment of the present invention.

FIG. 4 illustrates a circuit diagram of the WP controller 260 according to an exemplary embodiment of the present invention.

Referring to FIG. 4, the WP controller 260 may be manufactured in the form of an Integrated Circuit (IC) chip including four NAND gates 410, 420, 430 and 440.

In addition, possible enable/disable states of respective terminals (pins) of the NAND flash memory 230 are shown. For example, it is noted that pins #9, #8, #18 and #19 are enabled when their input signals are in an active Low state, and an output signal for pin #7 is a Ready signal when in a High state and is a Busy signal when in a Low state.

An input terminal 1 of the first NAND gate 410 is connected to the terminal 7 of the NAND flash memory 230, to receive an R/B signal from the NAND flash memory 230.

The second NAND gate 420 outputs at output terminal 6 the R/B signal received from the NAND flash memory 230, to the PLD 220. That is, the second NAND gate 420 is connected to the first NAND gate 410, serving as a buffer. Therefore, the R/B signal output from the terminal 7 of the NAND flash memory 230 is provided to the PLD 220 regardless of operations of the first and second NAND gates 410 and 420.

An output terminal 8 of the third NAND gate 430 is connected to the terminal 19 of the NAND flash memory 230, and outputs a WP signal to the NAND flash memory 230. An input terminal 9 of the third NAND gate 430 is connected to the input terminals 1 and 2 of the first NAND gate 410, and an input terminal 10 of the third NAND gate 430 is connected to an output terminal 11 of the fourth NAND gate 440.

Input terminals 12 and 13 of the fourth NAND gate 440 are connected to the PLD 220, and receive a WP signal NAND WP from the PLD 220.

Upon power off of the system, the WP controller 260 controls a WP signal in the following method. Upon receiving a Low-state WP signal from the PLD 220, the fourth NAND gate 440 outputs a High signal to the input terminal 10 of the third NAND gate 430.

In order for the WP controller 260 to output a Low-state WP signal, a Ready signal should be input to the input terminal 9 of the third NAND gate 430. That is, if a High signal is input to both the input terminals 9 and 10 of the third NAND gate 430, the output terminal 8 of the third NAND gate 430 outputs a Low-state WP signal.

On the other hand, if a Low-state Busy signal is input to the input terminal 9 of the third NAND gate 430, the third NAND gate 430 does not output a WP signal for stopping the operation of the NAND flash memory 230.

In sum, the WP controller 260 controls the WP signal using the WP signal received from the PLD 220 and the R/B signal output from the NAND flash memory 230. In other words, even though the WP signal is received from the PLD 220, the WP controller 260 outputs the Low-state WP signal only when the Ready signal is received from the NAND flash memory 230.

Figure 5:
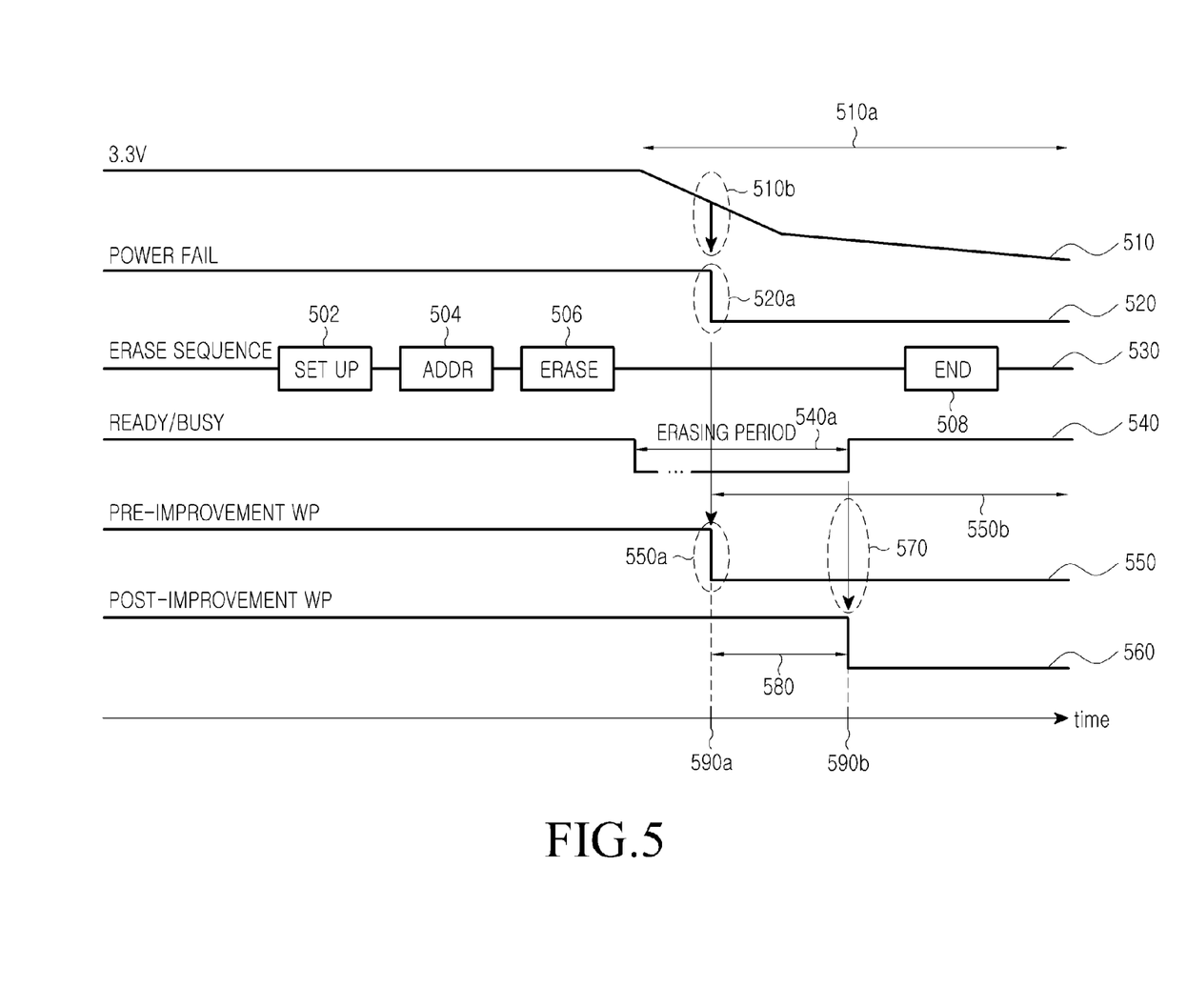
FIG. 5 is a diagram illustrating timings of pre/post-improvement WP signals according to an exemplary embodiment of the present invention.

FIG. 5 illustrates a timing diagram of pre/post-improvement WP signals according to an exemplary embodiment of the present invention. The NAND flash memory 230 has Read, Write, and Erase operations, and in FIG. 5, timings of pre/post-improvement WP signals will be described based on the Erase operation having the longest Busy time, among the above operations.

Referring to FIG. 5, an erasure procedure of the NAND flash memory 230 roughly includes a setup process SET UP 502, an addressing process ADDR 504, an erase process ERASE 506, and an end process END 508.

In FIG. 5, reference numeral 510 represents a timing curve of a voltage generated in the power supply unit 240, reference numeral 520 represents a timing curve for a power fail signal, reference numeral 530 represents a timing curve of an erase operation of the NAND flash memory 230, reference numeral 540 represents a timing curve of an R/B signal, reference numeral 550 represents a timing curve of a pre-improvement WP signal in the common technology, and reference numeral 560 represents a timing curve of a post-improvement WP signal in an exemplary embodiment of the present invention.

Reference numeral 540a represents a period for which an actual erasure operation is performed in the NAND flash memory 230, i.e., a period for which the NAND flash memory 230 is in a Busy state.

When making an access to its internal memory cells and performing the erase process 506, the NAND flash memory 230 outputs a Low-state Busy signal (Low-state R/B signal) to the WP controller 260.

At this point, if the system is powered off, a voltage output from the power supply unit 240 drops as represented by reference numeral 510a. The power detector 250 detects a point 510b where 10% of the output voltage drops, and outputs to the PLD 220 the power fail signal 520 that transitions from High to Low as represented by reference numeral 520a.

If the power fail signal is generated at the point 520a (causing a falling edge), the existing system corresponding to reference numeral 550 generates a WP signal (see 550a) at occurrence (see 520a) of the power fail signal. That is, at the time 520a that the power fail signal is generated, the existing system changes the WP signal 550 from a High state to a Low state (see 550a), and outputs the Low-state WP signal to the NAND flash memory 230 as represented by reference numeral 550b.

On the other hand, the system according to an exemplary embodiment of the present invention generates the WP signal upon completion (see 570) of the erasure operation of the NAND flash memory 230 as represented by the timing curve 560. That is, the WP controller 260 outputs the Low-state WP signal to the NAND flash memory 230 at the time 570 that the R/B signal transitions from Low (Busy) to High (Ready). In other words, in an exemplary embodiment of the present invention, the WP signal transmitted to the NAND flash memory 230 is delayed by a period 580 between points 590a and 590b.

The reason is that memory cells may be damaged if the write protection is performed during an access to the memory cells in the NAND flash memory 230 after detection of a power fail signal. Therefore, in an exemplary embodiment of the present invention, the WP signal is output to the NAND flash memory 230 after waiting until the access to the memory cells is normally completed. In addition, for the time period in which the access to the memory cells is normally completed, backup power is supplied to continue the operations of the NAND flash memory 230 and the WP controller 260.

Figure 6:
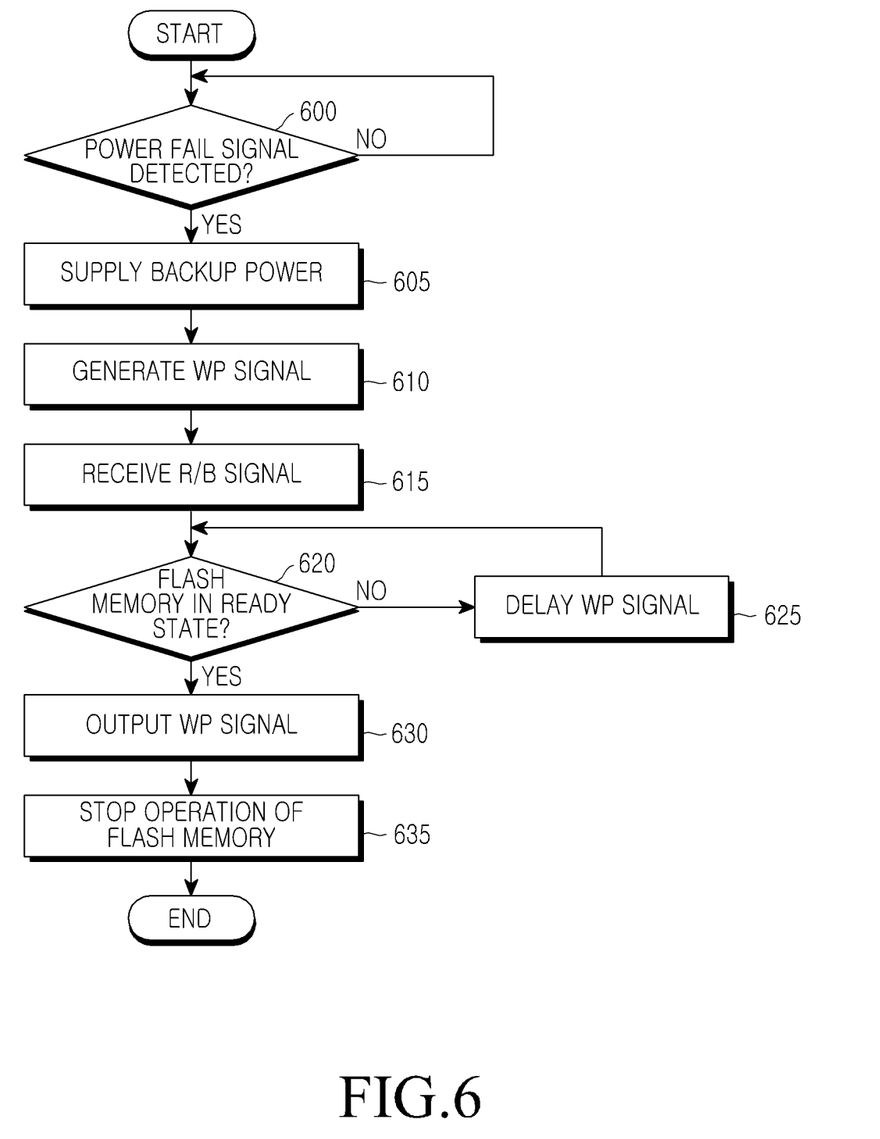
FIG. 6 is a flowchart illustrating a method for protecting data in a NAND flash memory according to an exemplary embodiment of the present invention.

FIG. 6 illustrates a procedure for protecting data in a NAND flash memory according to an exemplary embodiment of the present invention.

Referring to FIG. 6, the power detector 250 determines in step 600 whether a power fail signal is detected, by monitoring a DC voltage output from the power supply unit 240. The power detector 250 may detect an occurrence of the power fail signal if the DC voltage drops by a predetermined reference voltage, for example, corresponding to 10% of the full voltage.

If the power fail signal is detected, the power backup unit 270 supplies the backup power to the NAND flash memory 230 and the WP controller 260 from the detection of the power fail signal till termination of the operation of the NAND flash memory 230, in step 605.

In step 610, upon receiving the power fail signal from the power detector 250, the PLD 220 outputs a Low-state WP signal to the WP controller 260 to stop the operation of the NAND flash memory 230. In step 615, the WP controller 260 receives an R/B signal from the NAND flash memory 230 through the R/B signal line 180. If a specific operation of the NAND flash memory 230 is in progress, a Busy signal is output, and otherwise, a Ready signal is output. The WP controller 260 determines in step 620 whether a Ready signal is received through the R/B signal line 180. Upon receiving the Ready signal, the WP controller 260 outputs a WP signal to the NAND flash memory 230 in step 630, and upon receiving the WP signal, the NAND flash memory 230 stops its operation in step 635.

In contrast, if the NAND flash memory 230 is not in the Ready state but instead is in a Busy state in step 620, the WP controller 260 delays the WP signal in step 625, and returns to step 620 to continuously determine whether the NAND flash memory 230 is in a Ready state. The WP controller 260 outputs the WP signal if it is determined that the NAND flash memory 230 is in the Ready state. In conclusion, the WP controller 260 delays the WP signal until the NAND flash memory 230 transitions to the Ready state.

As is apparent from the foregoing description, an apparatus and method according to an embodiment of the present invention prevents a possible damage of a NAND flash memory, which may take place when a user arbitrarily turns off the system power or when an unscheduled outage occurs, thereby ensuring a stable operation of the system.

While the invention has been shown and described with reference to certain exemplary embodiments thereof, it will be understood by those skilled in the art that various changes in form and details may be made therein without departing from the spirit and scope of the invention as defined by the appended claims and their equivalents.

Namely, a data protection technology in a system with a NAND flash memory has been described so far. However, the present invention may be applied to other memory devices with a flash memory without departing from the scope or spirit of the invention.

What is claimed is:

1. An apparatus for protecting data in a flash memory, the apparatus comprising:
    a power detector for monitoring a voltage output from a power supply unit, and for outputting a power fail signal when the voltage drops by a predetermined reference voltage or more;
    a Programmable Logic Device (PLD) for outputting a Write Protect (WP) signal for performing write protection on the flash memory upon receiving the power fail signal from the power detector; and
    a WP controller for receiving the WP signal from the PLD, for receiving a Ready/Busy (R/B) signal from the flash memory, and for outputting the WP signal output from the PLD to the flash memory according to the R/B signal received from the flash memory.

2. The apparatus of claim 1, further comprising a power backup unit for supplying power to the flash memory and to the WP controller upon power off.

3. The apparatus of claim 2, wherein the power backup unit supplies backup power from a detection of the power fail signal till a termination of an operation of the flash memory.

4. The apparatus of claim 1, wherein the predetermined reference voltage comprises 10% of the voltage output from the power supply unit.

5. The apparatus of claim 1, wherein if the WP signal is received at the WP controller from the PLD when the R/B signal indicates that the flash memory is in a Busy state, the WP controller delays outputting the WP signal to the flash memory until receiving the R/B signal indicating that the flash memory is in a Ready state.

6. The apparatus of claim 1, wherein the WP controller outputs the received WP signal to the flash memory only when receiving the R/B signal indicating that the flash memory is in a Ready state from the flash memory.

7. The apparatus of claim 1, wherein the flash memory outputs the R/B signal indicating that the flash memory is in a Busy state while at least one of Write, Read, and Erase operations is performed in the flash memory.

8. The apparatus of claim 1, wherein the WP signal performs the write protection by disabling Read, Write, and Erase operations of the flash memory.

9. A method for protecting data in a flash memory, the method comprising:
    monitoring a voltage output from a power supply unit, and detecting a power fail signal if the voltage drops by a predetermined reference voltage or more;
    upon detecting the power fail signal, generating a Write Protect (WP) signal for performing write protection on the flash memory; and
    outputting the WP signal to the flash memory according to a Ready/Busy (R/B) signal received from the flash memory.

10. The method of claim 9, further comprising supplying backup power to the flash memory from the detection of the power fail signal till a termination of an operation of the flash memory.

11. The method of claim 9, wherein the predetermined reference voltage comprises 10% of the voltage output from the power supply unit.

12. The method of claim 9, wherein the outputting comprises delaying the outputting of the WP signal to the flash memory until the flash memory outputs the R/B signal indicating that the flash memory is in a Ready state, if the WP signal is generated when the flash memory outputs the R/B signal indicating that the flash memory is in a Busy state.

13. The method of claim 9, wherein the outputting of the WP signal to the flash memory comprises outputting the WP signal to the flash memory only when receiving the R/B signal indicating that the flash memory is in a Ready state from the flash memory.

14. The method of claim 9, wherein the flash memory outputs the R/B signal indicating that the flash memory is in a Busy state while at least one of Write, Read, and Erase operations is performed in the flash memory.

15. The method of claim 9, wherein the WP signal performs the write protection by disabling Read, Write, and Erase operations of the flash memory.

* * * * *